(12) United States Patent
Li et al.

(10) Patent No.: US 9,082,991 B2
(45) Date of Patent: Jul. 14, 2015

(54) OLED DISPLAY DEVICE AND CORRESPONDING FLEXIBLE PRINTED CIRCUIT

(71) Applicants: Shanghai Tianma Micro-Electronics Co., Ltd., Shanghai (CN); Tianma Micro-Electronics Co., Ltd., Shenzhen (CN)

(72) Inventors: Yujun Li, Shanghai (CN); Bengang Zhao, Shanghai (CN); Kai Tian, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/226,766

(22) Filed: Mar. 26, 2014

(65) Prior Publication Data

US 2015/0060782 A1   Mar. 5, 2015

(30) Foreign Application Priority Data

Aug. 29, 2013   (CN) .......................... 2013 1 0385385

(51) Int. Cl.
*H01L 23/544* (2006.01)
*H01L 51/00* (2006.01)
*H01L 27/32* (2006.01)

(52) U.S. Cl.
CPC ........ *H01L 51/0097* (2013.01); *H01L 27/3244* (2013.01); *H05K 2201/2027* (2013.01)

(58) Field of Classification Search
None
See application file for complete search history.

(56) References Cited

FOREIGN PATENT DOCUMENTS

KR     20080034732 A    4/2008

*Primary Examiner* — Yasser A Abdelaziez
(74) *Attorney, Agent, or Firm* — Kilpatrick Townsend & Stockton LLP

(57) ABSTRACT

An Organic Light-Emitting Diode (OLED) display device and a corresponding flexible printed circuit (FPC) are disclosed. The display device includes a first substrate and a second substrate arranged in opposition. In addition, frit is arranged on an inner side of the first substrate, and the display device also includes at least one bonding mark, where the bonding mark includes the frit, and at least one sub-bonding mark arranged on a surface of the first substrate. The at least one sub-bonding mark includes a first portion and a second portion arranged apart from each other, and the first portion and the second portion are arranged at an edge of the frit. The FPC includes at least one auxiliary bonding mark aligning the FPC to the OLED display device, where the at least one auxiliary bonding mark is aligned with the at least one sub-bonding mark of the OLED display device.

11 Claims, 5 Drawing Sheets

OLED DISPLAY DEVICE AND CORRESPONDING FLEXIBLE PRINTED CIRCUIT

CROSS-REFERENCES TO RELATED APPLICATIONS

This application claims the benefit of priority to Chinese Patent Application No. 201310385385.3, filed with the Chinese Patent Office on Aug. 29, 2013 and entitled "OLED DISPLAY DEVICE AND CORRESPONDING FLEXIBLE PRINTED CIRCUIT", the content of which is incorporated herein by reference in its entirety.

TECHNICAL FIELD

The present invention relates to a field of OLED (organic light-emitting diode), in particular to an OLED display device and a corresponding flexible printed circuit (FPC).

BACKGROUND OF THE INVENTION

At present, in the existing OLED display device, a control signal is generally transmitted to the display device through such external circuits as flexible printed circuit (FPC), and the like, so that the FPC needs to be bonded with the OLED display device, namely, a golden finger on the FPC is bonded with a corresponding pad on the display device to transmit the signal from the FPC to the display device. Taking the OLED display device integrating a touch function as an example, FPC is firstly aligned to the OLED display device through a bonding mark to align the golden finger of the FPC to the pad on the substrate of the OLED display device, and then, the golden finger is bonded with the pad through a conductive glue.

However, in the prior art, the OLED display device is generally encapsulated by melting frit (also called encapsulation frit) coated on substrates of the OLED display device through laser irradiation to encapsulate the two substrates. The bonding mark for alignment of the FPC and the OLED display device is formed above the frit. We know that the frit needs to be welded by a laser in a welding process, so that the color of its material is deep or black to benefit light absorption. In addition, the material of the bonding mark is generally indium tin oxide (ITO) which is of high transmittance (about 97%) and low reflectivity (about 7%). Therefore, an optical camera is difficult to capture the bonding mark, thus failing to successfully complete the bonding process. Furthermore, the bonding mark is located above the black frit, which causes laser reflection in the laser irradiation process and results in fluctuation in heat absorption to affect the encapsulation effect.

BRIEF SUMMARY OF THE INVENTION

An inventive aspect is an Organic Light-Emitting Diode (OLED) display device. The display device includes a first substrate and a second substrate arranged in opposition. In addition, frit is arranged on an inner side of the first substrate, and the display device also includes at least one bonding mark, where the bonding mark includes the frit, and at least one sub-bonding mark arranged on a surface of the first substrate. The at least one sub-bonding mark includes a first portion and a second portion arranged apart from each other, and the first portion and the second portion are arranged at an edge of the frit.

Another inventive aspect is a flexible printed circuit (FPC). The FPC includes at least one auxiliary bonding mark aligning the FPC to an OLED display device. The OLED display device includes a first substrate and a second substrate arranged in opposition. In addition, frit is arranged on an inner side of the first substrate, and the display device also includes at least one bonding mark, where the at least one bonding mark includes the frit, and at least one sub-bonding mark arranged on a surface of the first substrate. The at least one sub-bonding mark includes a first portion and a second portion arranged apart from each other, and the first portion and the second portion are arranged at an edge of the frit. In addition, the at least one auxiliary bonding mark is aligned with the at least one sub-bonding mark of the OLED display device.

Preferably, the OLED display device further includes at least one pad located on the outside surface of the first substrate, where the at least one pad is used for transmitting a signal received from an external circuit into the OLED display device. Each bonding mark further includes the at least one pad, where the at least one pad is overlapped with the frit, and width of the at least one pad in a direction perpendicular to an extension direction of the frit are larger than a width of the frit in the direction. In addition, the FPC further includes at least one golden finger for aligning the FPC to the OLED display device, where the at least one golden finger matches the at least one pad.

DETAILED DESCRIPTION OF THE PREFERRED EMBODIMENTS

In order to make the abovementioned purpose, characteristics and advantages of the present invention become more obvious, detailed illustration is made herein below on the specific embodiments of the present invention in combination with drawings.

In the following description, numerous specific details are set forth to fully understand the present invention, but the present invention can also be implemented by other manners different from the one described above, so that the present invention is not limited to the following disclosed specific embodiments.

An Embodiment

Figure 1:
FIG. 1 is a schematic sectional diagram of the OLED display device in an embodiment.

The embodiment of the present invention provides an OLED display device, as shown in FIG. 1, the OLED display device comprises a first substrate 1 and a second substrate 2 arranged in opposition, and frit 3 is arranged on the inner side of the first substrate 1. The first substrate 1 and the second substrate 2 are encapsulated by irradiating the frit 3 by a laser. Since a control signal is provided for the OLED display device through an external circuit, and generally, the external circuit can be a flexible printed circuit (FPC) 4, so the FPC 4 should be aligned to the first substrate 1 to ensure successful bonding between at least one golden finger on the FPC and at least one pad used for receiving the control signal on the first substrate 1. Therefore, the OLED display device generally comprises at least one bonding mark.

Figure 2:
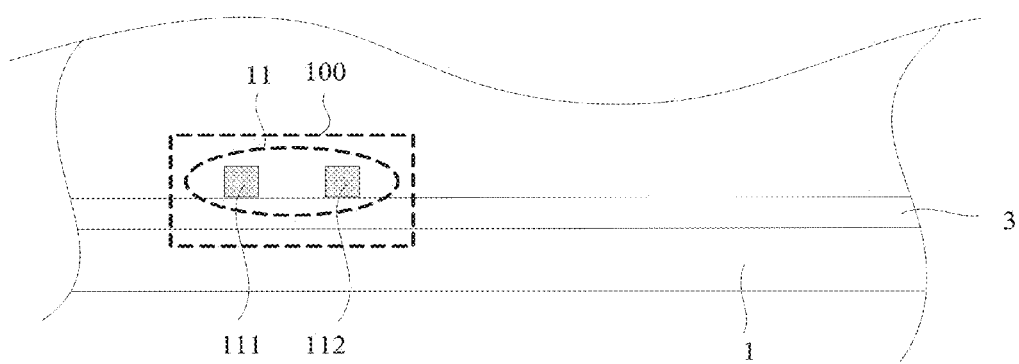
FIG. 2 to FIG. 4 are schematic diagrams of at least one bonding mark of the OLED display device in an embodiment.

As shown in FIG. 2, in the OLED display device provided by the embodiment of the present invention, at least one sub-bonding mark 11 is arranged on the surface of the first substrate 1, the sub-bonding mark 11 comprises a first portion 111 and a second portion 112 arranged apart from each other, the first portion 111 and the second portion 112 are arranged at the edge of the frit 3, and the sub-bonding mark 11 and the frit 3 form the bonding mark 100 together.

The sub-bonding mark 11 can be either located on the outside surface of the first substrate 1, namely, the side face away from the second substrate, or on the inside surface of the first substrate 1, namely, the side facing the second substrate, as long as the two patterns of the sub-bonding mark are arranged at the edge of the frit 3 in light transmission direction.

Figure 3A:
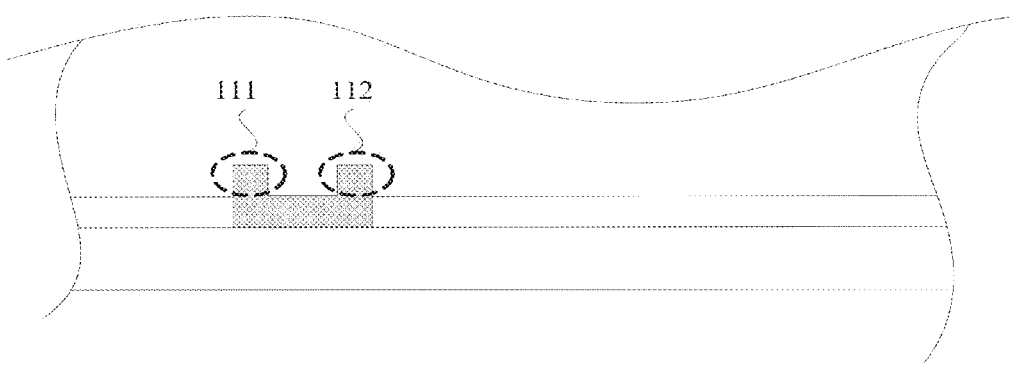
Figure 3B:
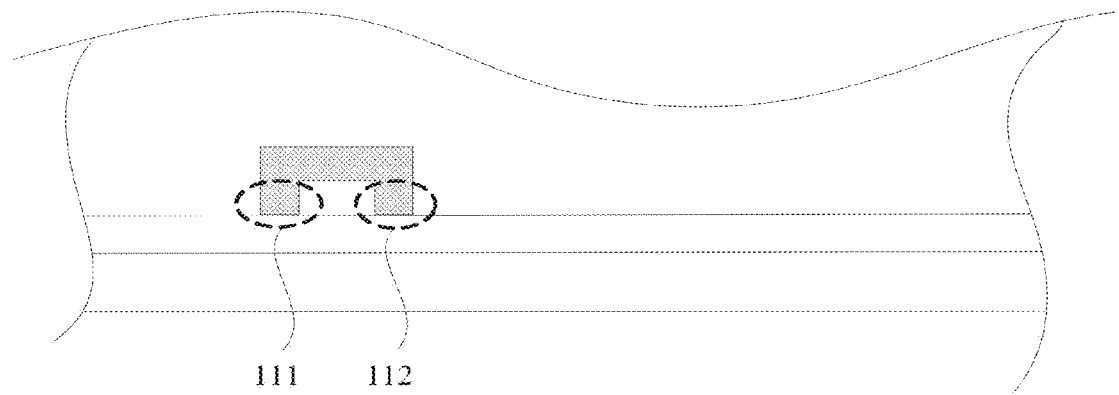
Figure 3C:
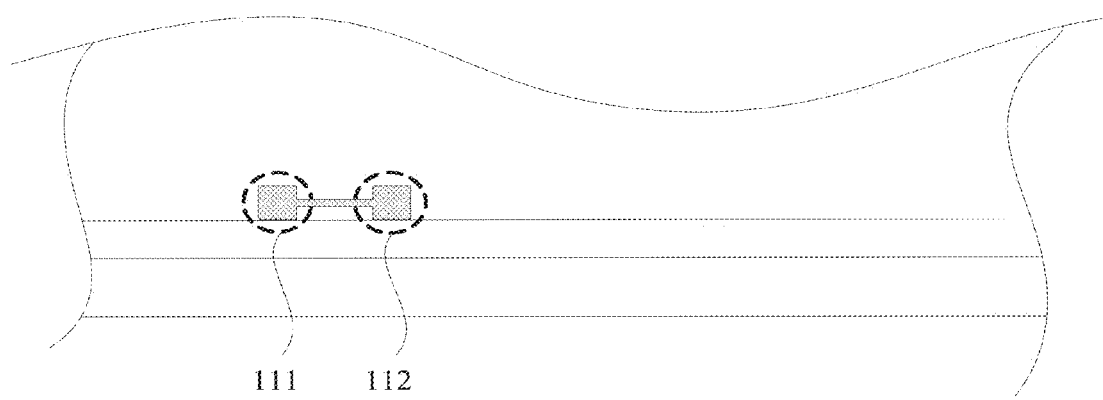

The sub-bonding mark can be of any pattern, but must comprise the first portion 111 and the second portion 112, which are arranged apart from each other at the edge of the frit 3, namely, the pattern of the sub-bonding mark can also comprise other portions besides the first portion 111 and the second portion 112. For example, the pattern of the sub-bonding mark can be of a "凵" pattern as shown in FIG. 3a; or of an inverted "凵" pattern as shown in FIG. 3b; or of an H-shaped pattern as shown in FIG. 3c. All of the patterns listed here comprise the first portion 111 and the second portion 112 which are arranged apart from each other at the edge of the frit 3.

Figure 3D:
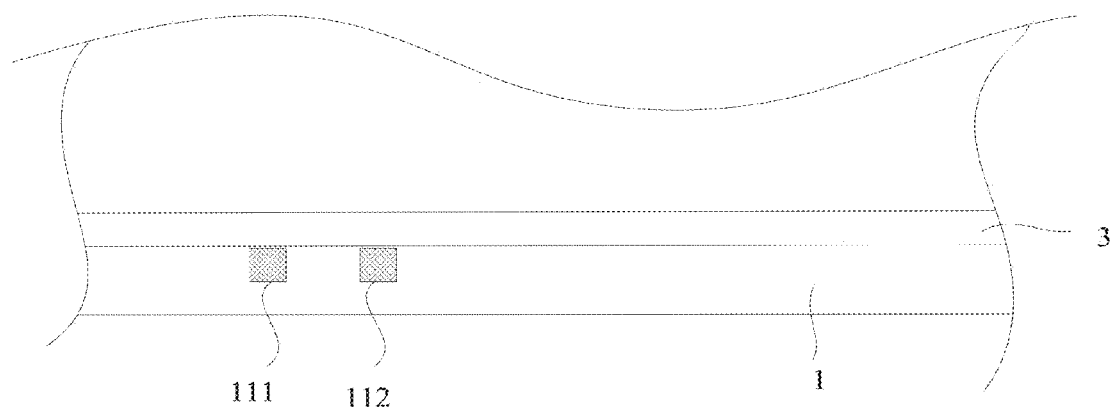

In addition, as long as the first portion 111 and the second portion 112 are arranged apart from each other at the edge of the frit 3, the first portion and the second portion can be arranged at one side of edge away from the edge of the first substrate 1 of the frit 3, as shown in FIG. 2, or can be arranged at one side of edge close to the edge of the first substrate 1 of the frit 3, as shown in FIG. 3d.

The OLED display device provided by the embodiment of the present invention is provided with at least one sub-bonding mark. The sub-bonding mark comprises the first portion and the second portion arranged apart from each other, and arranged at the edge of the frit. Therefore the bonding mark of the OLED display device is formed through the sub-bonding mark and the frit. By adopting the bonding mark of the embodiment of the present invention, the problem that a traditional bonding mark is directly formed on the frit to cause the optical camera to fail to capture the bonding mark is avoided, and meanwhile, laser fluctuation caused by laser reflection resulting from the bonding mark on the frit is avoided.

Figure 4:
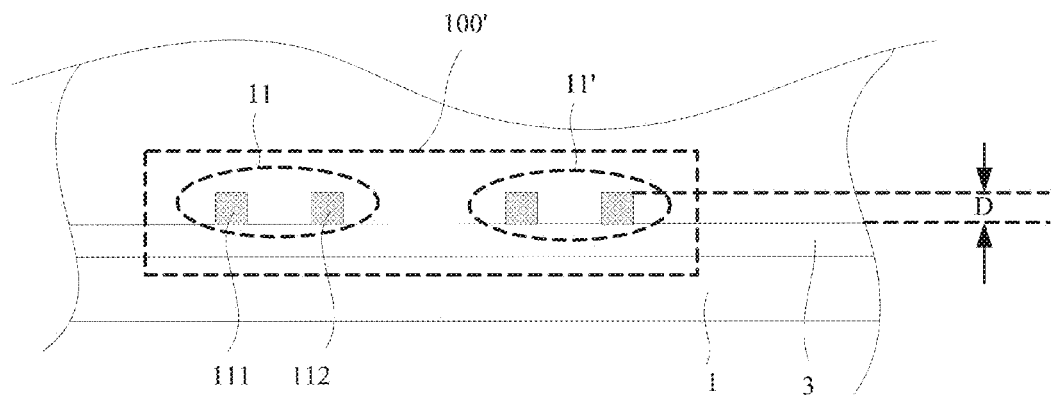

Preferably, in order to realize a more precise alignment, each bonding mark 100' of the OLED display device can comprise two sub-bonding marks 11 and 11', as shown in FIG. 4.

Preferably, the sub-bonding mark is made from metal or indium tin oxide. Further, the metal can be preferably molybdenum or niobium or an alloy of molybdenum and niobium.

Preferably, the height of the sub-bonding mark in the direction perpendicular to the extension direction of the frit can be 50 microns. In FIG. 4, namely, in the direction perpendicular to the extension direction of the frit 3, the height D of the sub-bonding mark 11 or 11' is 50 microns. Accordingly, the sub-bonding mark is easier to be captured by the optical camera due to the certain height, and the alignment accuracy is improved as a result. On a same consideration, the width of the frit can be preferably 600 microns.

Figure 5:
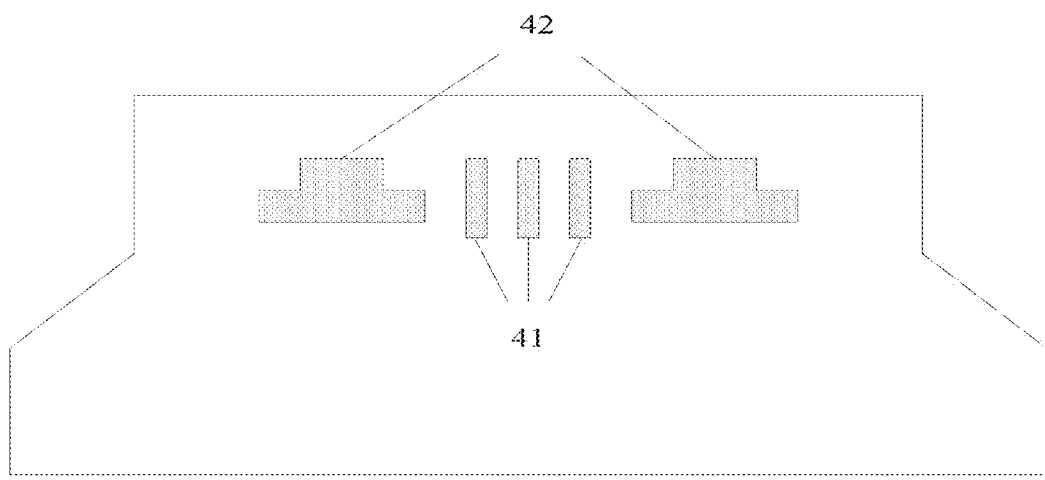
FIG. 5 is a schematic diagram of a FPC.
Figure 6:
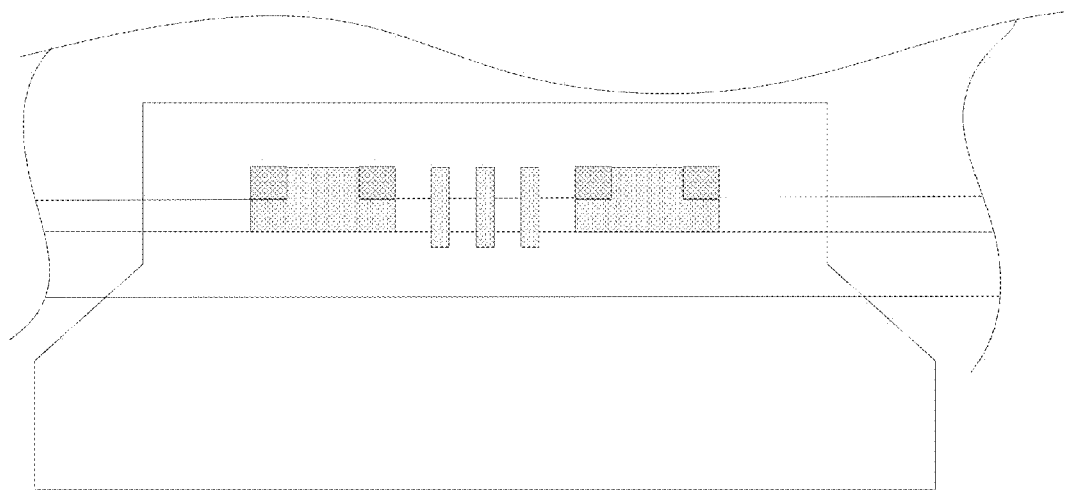
FIG. 6 is a schematic diagram of alignment of the OLED display device and the FPC in an embodiment.

In an actual application, a corresponding FPC is expected manufactured. Besides at least one golden finger 41 used for transmitting the control signal, the FPC, as shown in FIG. 5, further comprises at least one auxiliary bonding mark 42 matching the sub-bonding mark, which is used for aligning the FPC to the OLED display device. FIG. 6 is a schematic diagram after alignment of the FPC and the OLED display device (the at least one golden finger on the FPC is not shown in FIG. 6). The auxiliary bonding mark of the FPC can be preferably made by depositing a copper film and then formed by using a photolithography technology. The specific manufacturing process is not the key point of the present invention, so that this does not go into details.

Here, "matching" means that the position, size and shape or outline of the auxiliary bonding mark on the FPC are matched, adapted or embedded with those of the bonding mark of the OLED display device, so that the auxiliary bonding mark on the FPC and the bonding mark of the OLED display device can form an entirety.

Another Embodiment

Figure 7:
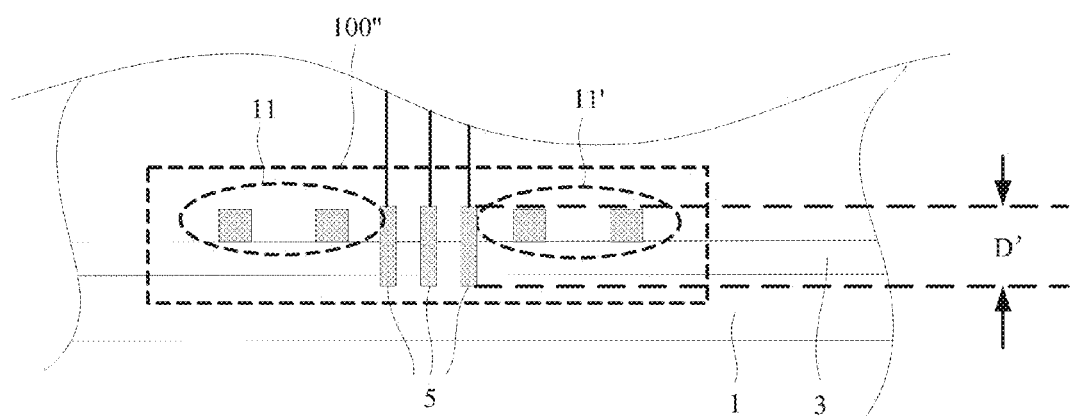
FIG. 7 is a schematic diagram of at least one bonding mark of the OLED display device in another embodiment.

The embodiment of the present invention further provides an OLED display device on the basis of the foregoing embodiment, the OLED display device comprises all characteristics of the OLED display device in the foregoing embodiment, the difference between the present embodiment and foregoing embodiment lies in that the OLED display device in the present embodiment further comprises at least one pad 5 located on the outer surface of the first substrate 1, as shown in FIG. 7. The at least one pad 5 is used for transmitting a signal received from external circuit into the OLED display device. Besides the sub-bonding marks 11 and 11' and the frit 3, the bonding mark 100" of the OLED display device further comprises the at least one pads 5. The at least one pad 5 is overlapped with the frit 3, and the width of the at least one pad 5 in the direction perpendicular to the extension direction of the frit 3 are larger than the width of the frit 3 in the direction.

It should be noted that each bonding mark 100" comprising two sub-bonding marks 11 and 11' is taken as an example for illustration in FIG. 7, however, a number of the sub-bonding marks is not limited in the embodiment, namely, each bonding mark in the embodiment can comprise one sub-bonding mark or more than two sub-bonding marks, as described in the foregoing embodiment.

Figure 8:
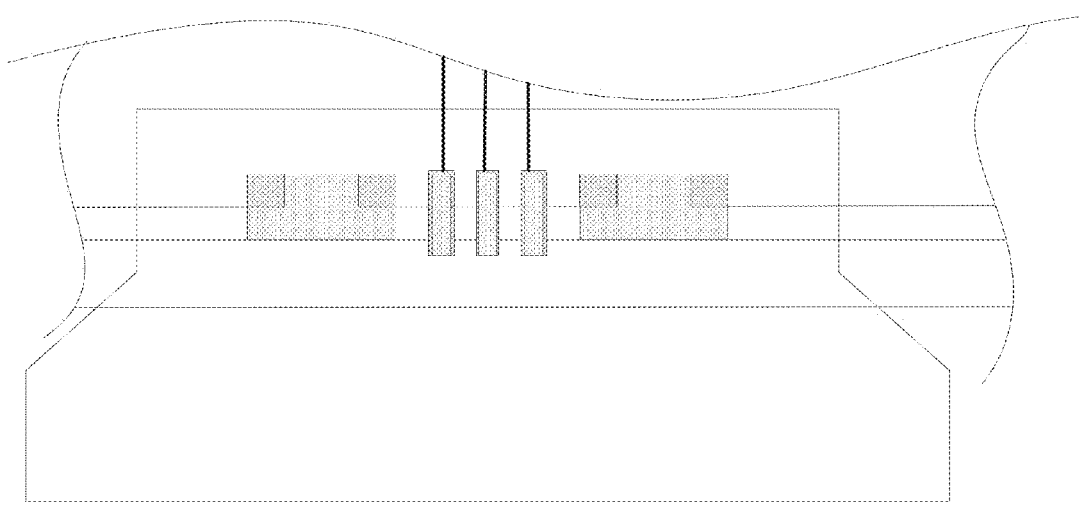
FIG. 8 is a schematic diagram of alignment of the OLED display device and the FPC in another embodiment.

In actual application, a corresponding FPC shown in FIG. 5 can be expected manufactured, the FPC comprises at least one auxiliary bonding mark 42 matching the sub-bonding mark of the OLED display device and at least one golden finger 41 matching the at least one pad, which is used for aligning the FPC to the OLED display device. As shown in FIG. 8, after the FPC is aligned to the OLED display device, the sub-bonding mark of the OLED display device matches the auxiliary bonding mark on the FPC, and the at least one pad of the OLED display device matches the at least one golden finger of the FPC.

In the embodiment, the at least one pad is regarded as a part of the bonding mark for checking or further accurately aligning the FPC to the OLED display device so as to ensure successful bonding between the FPC and the OLED display device.

As shown in FIG. 7, the at least one pad 5 is overlapped with the frit 3, and the width of the at least one pad in the direction perpendicular to the extension direction of the frit 3 is larger than the width of the frit 3 in the direction, so that the position of the at least one pad 5 is easier to be captured by the optical camera, or an alignment verification is easier to implement. Preferably, the width D' of the at least one pad 5 in the direction perpendicular to the extension direction of the frit 3 can be 900 microns.

Preferably, the at least one pad can be made from metal or indium tin oxide. Further, the metal can be molybdenum or niobium or an alloy of molybdenum and niobium.

In the embodiment, the external circuit is preferably a FPC, of course, it can also be other circuits. In order to make the present embodiment of the invention more easily understood, the FPC serving as an external circuit is described as an example of the embodiment, however, a limitation on the present invention should not be formed thereto.

In addition, the OLED display device of the present invention can be a display device integrating other functions. For example, in another embodiment of the present invention, the OLED display device is integrated with a touch function, and the first substrate can be a touch panel (TP). Specifically, touch electrodes can be further formed on the outside surface of the first substrate, the touch electrodes can form a conductive layer, as shown in FIG. 1, and the signal received from the external circuit by the touch electrodes through the at least one pad can be a touch signal.

In summary, the OLED display device and the matched FPC provided by the embodiments of the present invention are used for enabling an optical camera to more easily capture the bonding mark so as to align the OLED display device to an external circuit and may avoid the reflection effect to a laser from an ITO bonding mark adopted in the traditional manner on laser.

It should be noted that the abovementioned embodiments can be mutually learned and comprehensively used. Although the present invention has been disclosed in the preferred embodiments described above, but it is not intended to limit the present invention, possible modifications and variations on the technical scheme of the present invention may be made by those skilled in the art through the disclosed method and technical contents without departing from the spirit and scope of the present invention, thus any simple modifications, equivalent variations and decorations implemented on the embodiments according to the technical essence of the present invention without deviating from the contents of the technical scheme of the present invention come into the scope of the protection of the present invention.

What is claimed is:

1. An Organic Light-Emitting Diode (OLED) display device, comprising:
   a first substrate and a second substrate arranged in opposition, wherein frit is arranged on an inner side of the first substrate; and
   at least one bonding mark, comprising:
   the frit, and
   at least one sub-bonding mark arranged on a surface of the first substrate, wherein the at least one sub-bonding mark comprises a first portion and a second portion arranged apart from each other, and wherein the first portion and the second portion are arranged at an edge of the frit.

2. The OLED display device according to claim 1, wherein each of the at least one bonding mark comprises two sub-bonding marks.

3. The OLED display device according to claim 1, wherein the at least one sub-bonding mark is located on an outside surface of the first substrate or is located on an inside surface of the first substrate.

4. The OLED display device according to claim 1, wherein a height of the sub-bonding mark in a direction perpendicular to an extension direction of the frit is about 50 microns.

5. The OLED display device according to claim 1, wherein the width of the frit is about 600 microns.

6. The OLED display device according to claim 2, further comprising at least one pad located on the outside surface of the first substrate, wherein the at least one pad is configured to transmit a signal received from an external circuit into the OLED display device, wherein each of the at least one bonding mark further comprises the at least one pad, wherein the at least one pad overlaps the frit, and a width of the at least one pad in a direction perpendicular to an extension direction of the frit is greater than a width of the frit in the direction.

7. The OLED display device according to claim 1, wherein the at least one sub-bonding mark has a [Ц] pattern, or an inverted [Ц] pattern, or an H-shaped pattern.

8. The OLED display device according to claim 6, wherein the width of the at least one pad in the direction perpendicular to the extension direction of the frit is about 900 microns.

9. The OLED display device according to claim 6, wherein touch electrodes are further formed on an outside surface of the first substrate, and a signal received from the external circuit by the touch control electrodes through the at least one pad is a touch control signal.

10. A flexible printed circuit (FPC), comprising:
    at least one auxiliary bonding mark aligning the FPC to an OLED display device, wherein the OLED display device comprises:
    a first substrate and a second substrate arranged in opposition, wherein frit is arranged on an inner side of the first substrate; and
    at least one bonding mark, comprising:
    the frit, and
    at least one sub-bonding mark arranged on a surface of the first substrate, wherein the at least one sub-bonding mark comprises a first portion and a second portion arranged apart from each other, wherein the first portion and the second portion are arranged at an edge of the frit, and wherein the at least one auxiliary bonding mark is aligned with the at least one sub-bonding mark of the OLED display device.

11. The FPC according to claim 10, wherein each of the at least one bonding mark comprises two sub-bonding marks, and wherein the OLED display device further comprises at least one pad located on the outside surface of the first substrate, wherein the at least one pad is configured to transmit a signal received from an external circuit into the OLED display device, wherein each of the at least one bonding mark further comprises the at least one pad, wherein the at least one pad overlaps the frit, and a width of the at least one pad in a direction perpendicular to an extension direction of the frit is greater than a width of the frit in the direction, and
    wherein the FPC further comprises at least one golden finger aligning the FPC to the OLED display device, wherein the at least one golden finger is aligned with the at least one pad.

* * * * *